(12) United States Patent
Micheloni et al.

(10) Patent No.: US 7,184,319 B2
(45) Date of Patent: *Feb. 27, 2007

(54) METHOD FOR ERASING NON-VOLATILE MEMORY CELLS AND CORRESPONDING MEMORY DEVICE

(75) Inventors: Rino Micheloni, Turate (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 10/675,221

(22) Filed: Sep. 30, 2003

(65) Prior Publication Data

US 2004/0208063 A1    Oct. 21, 2004

(30) Foreign Application Priority Data

Sep. 30, 2002    (EP) .................................. 02425591

(51) Int. Cl.
  *G11C 16/16*    (2006.01)
  *G11C 16/08*    (2006.01)
  *G11C 29/04*    (2006.01)
  *G11C 29/24*    (2006.01)

(52) U.S. Cl. .......................... 365/185.29; 365/185.09; 365/200; 365/185.23; 365/201; 365/195

(58) Field of Classification Search ........... 365/185.29, 365/185.23, 185.33, 185.09, 185.11, 185.2, 365/185.22, 200, 201, 195

See application file for complete search history.

(56) References Cited

U.S. PATENT DOCUMENTS

| | | | | |
|---|---|---|---|---|
| 4,538,245 A | * | 8/1985 | Smarandoiu et al. | .. 365/185.04 |
| 5,077,691 A | | 12/1991 | Haddad et al. | ............. 365/218 |
| 5,233,559 A | * | 8/1993 | Brennan, Jr. | ........... 365/185.09 |
| 5,262,993 A | * | 11/1993 | Horiguchi et al. | .......... 365/200 |
| 5,265,055 A | * | 11/1993 | Horiguchi et al. | .......... 365/200 |
| 5,347,489 A | * | 9/1994 | Merchant et al. | ........... 365/203 |
| 5,418,752 A | * | 5/1995 | Harari et al. | ................ 365/218 |
| 5,452,251 A | | 9/1995 | Akaogi et al. | .............. 365/200 |
| 5,502,674 A | * | 3/1996 | Griffus et al. | .............. 365/200 |
| 5,618,742 A | * | 4/1997 | Shone et al. | ................. 438/263 |
| 5,659,550 A | | 8/1997 | Mehrotra et al. | .......... 371/21.4 |

(Continued)

FOREIGN PATENT DOCUMENTS

EP    0 797 145 A1    9/1997

(Continued)

*Primary Examiner*—J. H. Hur
(74) *Attorney, Agent, or Firm*—Lisa K. Jorgenson; Dennis M. de Guzman; Seed IP Law Group PLLC

(57) ABSTRACT

The invention relates to a method for erasing non-volatile memory cells, and to a corresponding non-volatile memory device of the programmable and electrically erasable type implementing the method, and comprising a memory cell array organized in a row-and-column layout, and divided in array sectors, including at least one row decode circuit portion being supplied positive and negative voltages. The method is applied whenever the issue of the erase algorithm is negative, and comprises the following steps: forcing an incompletely erased sector into a read condition; scanning the rows of said sector to check for the possible presence of a spurious current indicating a fail state; identifying and electrically isolating the failed row; re-addressing from said failed row to a redundant row provided in the same sector; re-starting the erase algorithm.

22 Claims, 8 Drawing Sheets

U.S. PATENT DOCUMENTS

| | | | |
|---|---|---|---|
| 5,724,297 A * | 3/1998 | Noda et al. | 365/226 |
| 5,862,080 A | 1/1999 | Harari et al. | 365/185.29 |
| 5,978,264 A | 11/1999 | Onakado et al. | 365/185.11 |
| 6,304,488 B1 * | 10/2001 | Abedifard et al. | 365/185.23 |
| 6,532,181 B2 | 3/2003 | Saito et al. | 365/200 |
| 6,553,510 B1 | 4/2003 | Pekny | 714/6 |
| 6,947,329 B2 * | 9/2005 | Campardo et al. | 365/185.26 |

FOREIGN PATENT DOCUMENTS

EP    1 126 372 A1    8/2001

* cited by examiner

METHOD FOR ERASING NON-VOLATILE MEMORY CELLS AND CORRESPONDING MEMORY DEVICE

CROSS-REFERENCE TO RELATED APPLICATION

This application relates to U.S. patent application with U.S. application Ser. No. 10/675,805, filed on Sep. 30, 2003, entitled METHOD FOR DETECTING A RESISTIVE PATH OR A PREDETERMINED POTENTIAL IN NON-VOLATILE MEMORY ELECTRONIC DEVICES, now pending, which application is incorporated herein by reference in its entirety.

FIELD OF THE INVENTION

The present invention relates to a method for erasing non-volatile memory cells incorporated in a memory cell array divided into sectors.

BACKGROUND OF THE INVENTION

As it is well known, a faulty condition known as the "erase fail", on the occurrence of which at least one memory sector can no longer be erased, has grown to be a major problem with last-generation flash memories.

This faulty condition is determined by the way an erase operation, the so-called channel erasing, is carried out.

More particularly, it is known to erase all the cells of a whole sector of a flash memory array by applying a suitable voltage to the control terminals of the memory cells.

FIG. 1 shows, schematically and to an enlarged scale, a portion of a semiconductor integrated circuit, which is fabricated conventionally to a flash memory cell 4. In particular, this portion 1 comprises a substrate 2 doped with a first dopant that may be of the P type. The substrate 2 serves the whole wafer where the portion 1 is also formed.

Preferably, a three-well structure, including an intermediate well 3 and an innermost well 5 in which the flash memory cell 4 is integrated, is preferably formed in the substrate 2.

Actually, all the cells 4 of a given sector of the flash memory array are formed in the innermost well 5. The well 5 is also doped with the first dopant of the P type, and a source region 6 and a drain region 7 of the cell 4 are formed towards its surface. These regions are islands of a second type of dopants that may be of the N type.

A thin layer of tunnel oxide separates the surface of the well 5 from a floating gate region 8, the latter being separated from a control gate region 9 by means of an isolation layer 10, which is usually an interpoly oxide 10, also called ONO layer.

The cell 4 is connected to first or positive and second or negative charge pump circuits 11 and 12, respectively.

During an erase operation, the innermost well 5 is applied a predetermined positive voltage value by means of the first or positive charge pump circuit 11. The value of this positive voltage usually reaches +8V, and is also applied to the floating gate region 8. The control gate region 9, on the other hand, is brought to a negative voltage value that reaches −9V by means of the second charge pump circuit 12.

In FIG. 1 this situation is schematically shown, in the form of paths illustrating the application of the above voltage values.

In this situation, the voltage across the interpoly oxide layer 10 may rise to a value equal to 17V and exceed it.

Where weak points occur in the structure of the interpoly oxide layer 10, the layer is apt to deteriorate and even to break. When it does, the second or negative charge pump circuit 12 becomes shorted to the first or positive charge pump circuit 11 while the cell 4 is erased, as indicated in FIG. 2 by the conduction path 13.

A net outcome is that one or more of the cells in the sector affected by the short-circuit in well 5 is not erased, thus bringing the memory to an erase-fail state.

The prior art already proposes a way to overcome this problem that consists of applying a field redundancy concept in the erase algorithm, with attendant sector redundancy.

More particularly, this prior proposal consists of replacing a failed memory element, or even a whole memory sector, with a new element. The erase algorithm is suitably modified, so to have the erase operation performed on the redundant sectors and not on the failed sectors anymore.

Furthermore, the redundancy operation would be available through the service life of a memory device on the market, as well as to the test procedures for factory testing memory devices before delivery.

In particular, in the course of an erase operation, a check phase is performed, which allows to divert the erase operation to a "sparing" sector in the event of sector failing and thus to properly erase such a sector.

Of course, this can only be accomplished if one or more redundant sectors are available to replace the failed ones. Thus, the main shortcoming of the above prior proposal is that each device must be equipped with a whole redundant sector even if only one cell in the failed sector actually requires replacement.

It should be noted in this respect that the average size of a flash memory sector is 1 Mbit, and that erase fails are frequent occurrences. Thus, it would be necessary to use a large number of sectors having large dimensions to effectively correct faulty devices. On the contrary, replacing memory cell sectors bodily is a comparatively simple matter, although heavily restrictive of circuit area: it is merely necessary to arrange for the address of a sector found failed to be "shifted" to a redundant sector each time that the failed sector is addressed.

SUMMARY OF THE INVENTION

The underlying technical objective of this invention is to provide a method of erasing non-volatile memory cells, and a memory device implementing the method, with appropriate functional and constructional features.

The solution on which the present invention stands includes pinpointing the elements responsible for a fail condition and suitably isolating them from the remainder of the sector, such that only these elements will become involved in the redundancy procedure. Briefly, the invention provides a redundancy feature aimed at each sector rather than at the whole device.

Based on this idea, the technical problem is solved by a method as above indicated, and as defined in claim 1.

The problem is further solved by an integrated memory device of the type defined in claim 9.

The invention relates to a method of erasing non-volatile memory cells in an integrated non-volatile memory device that comprises a memory cell array organized in a row-and-column layout and divided in array sectors, each including at least one row decode circuit portion being supplied positive and negative voltages, and of the type wherein the array sectors can be erased independently of one another by means of an erase algorithm.

The invention also relates to an integrated memory device implementing the above method.

Although not limited to, the invention relates to an electronic memory device, which is monolithically integrated in a semiconductor and comprises an array of non-volatile memory cells, e.g., flash EEPROM cells; the following description is made with reference to the above application field for convenience of illustration only.

The features and advantages of the method and the device according to the invention should become understood from the following description of embodiments thereof, given by way of example and not of limitation with reference to the accompanying drawings.

DETAILED DESCRIPTION OF THE INVENTION

Figure 1:
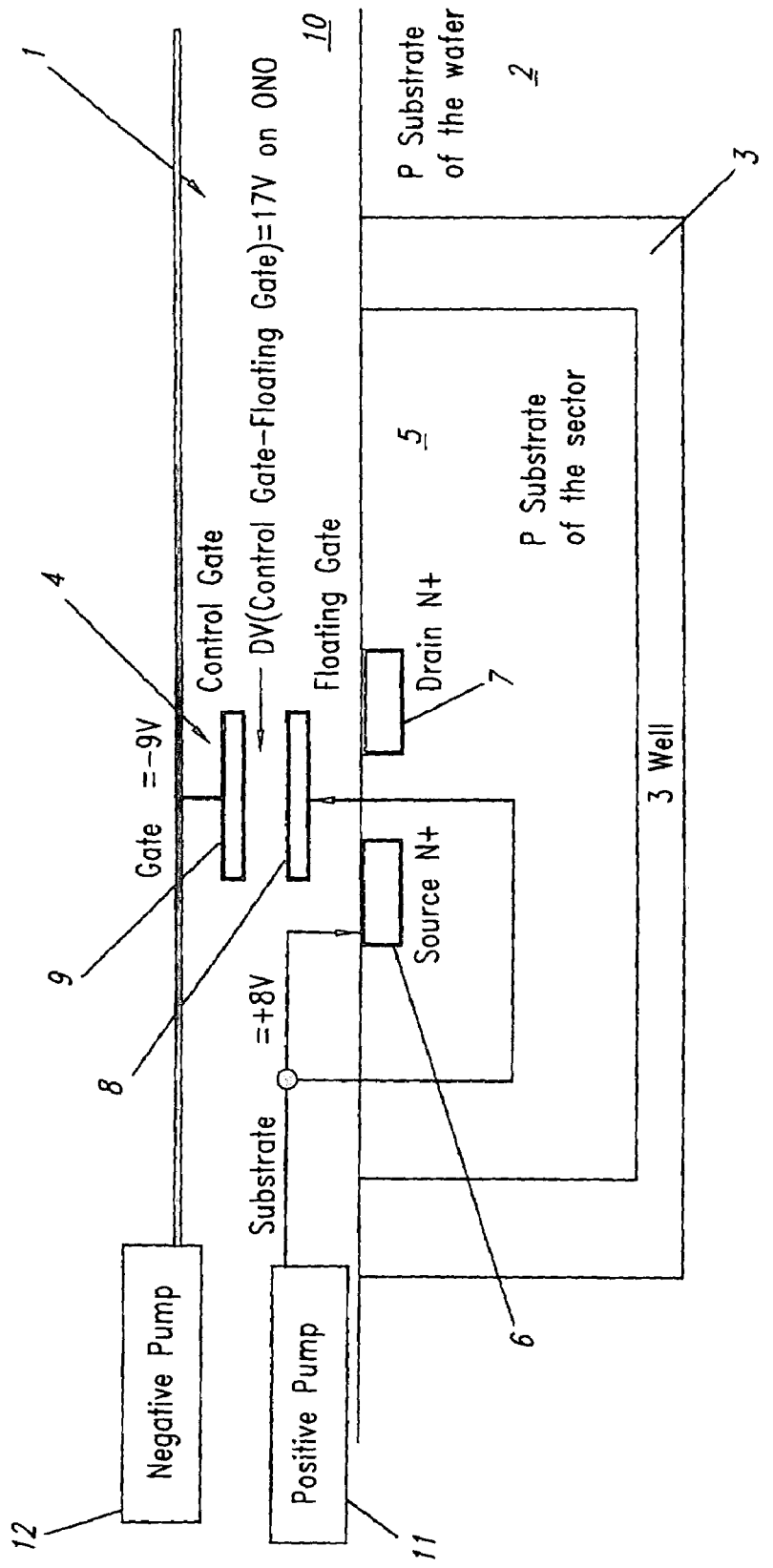
FIG. 1 schematically shows a portion of a semiconductor substrate where a non-volatile memory cell has been integrated according to the prior art.
Figure 2:
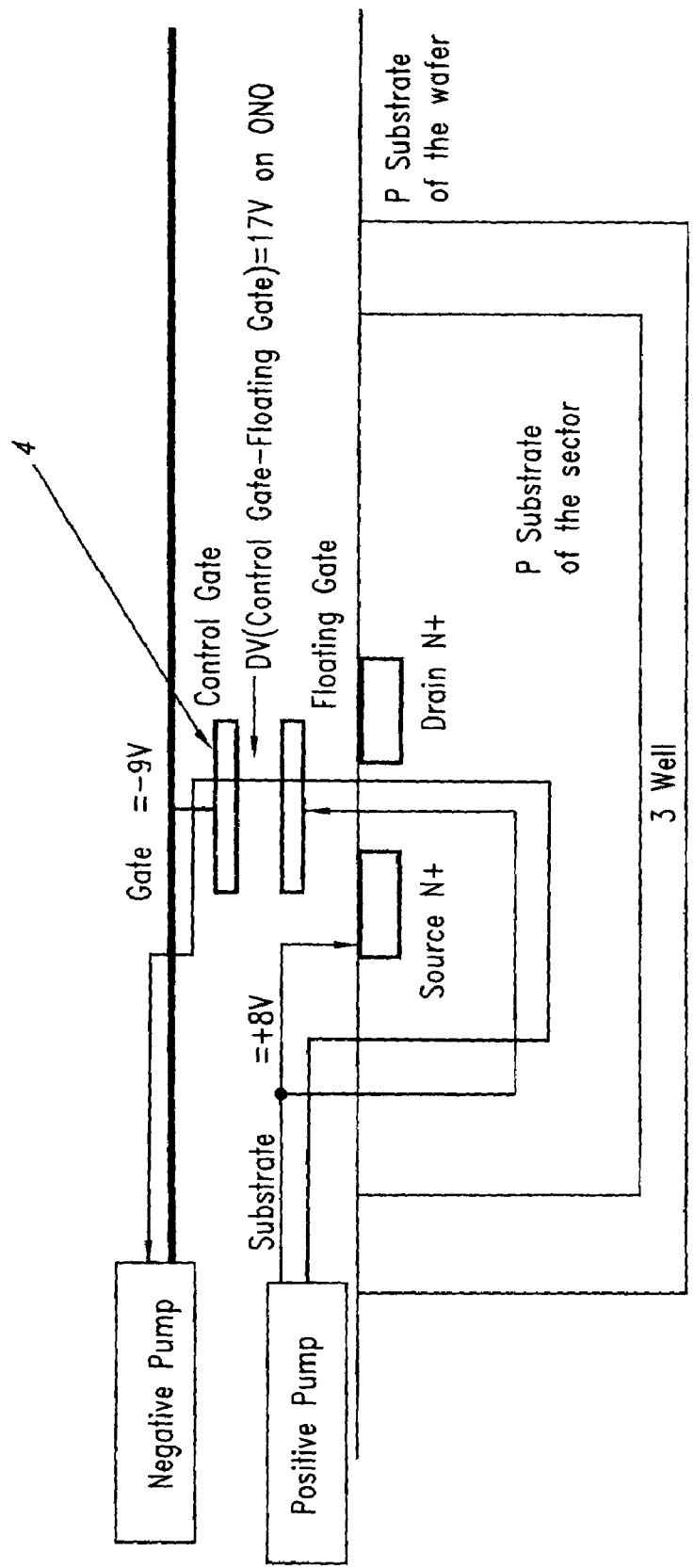
FIG. 2 schematically shows the same cell as in FIG. 1 and the fail condition, the so called erasing fail.

First of all the mechanisms that cause an erase fail condition, shown with reference to the prior art, can be analyzed in detail in order to understand all the aspects of this invention.

An erase fail condition is caused by the negative charge pump circuit 12, arranged to energize the control gate region (hereinafter abbreviated to "gate region") of a failed memory cell 4, becoming shorted to the positive charge pump circuit 11 which is energizing the source region 6 of the cell and the common substrate 5 of all the cells in a sector.

With charge pump circuits of conventional design, the voltage used during erase operations can be maintained not even if the failure occurs just at one cell. The voltage values are those provided by the splitting effect caused by the short-circuit and are transferred to both the control gate regions of the cells in the same row as the failed cell and to the gate regions of the other cells in the same sector. However, these are insufficient voltages to produce the electric fields that are required in order to start the tunneling effect which would enable the erase operation to be performed.

Furthermore, even if charge pumps adapted to deliver all the current that is required without incurring voltage drops were made available, the same difficulty would be met during the program and read operations because a spurious current would still be there, between a gate terminal and a ground reference to which the substrate is connected. This spurious current acts in any case to lower the voltage of the gate region. This can cause the entire sector to fail.

According to principles of the present invention, the expense of replacement of entire sectors as in the prior art is avoided. In one embodiment, this invention advantageously provides for redundant rows to be borne inside the memory device sector where a fail is likely to occur.

"Memory device" means here any monolithic electronic device that comprises an array of memory cells, laid into rows and columns, and circuit portions that are associated with the cell array to serve the functions of addressing, decoding, reading, writing, and erasing the contents of memory cells.

Such a device may be a sectored, electrically erasable non-volatile flash EEPROM chip integrated in a semiconductor.

Each memory cells would comprise a floating gate transistor having source, drain, and control gate terminals.

The circuit portions that are associated with the cell array include a row decode circuit portion, which is associated with each of the sectors and supplied by specified positive and negative voltages, being generated within the integrated memory circuit by voltage boosters or charge pumps and regulated by respective voltage regulators.

The teachings of this invention apply to an integrated memory device, wherein the array sectors can be erased independently of one another by means of an erase algorithm. The invention can correct a fail condition of even a single cell in one sector, by providing a local redundancy for each sector.

More particularly, the invention "suppresses" the spurious current caused by a failed cell that would also harm intact cells in the same sector.

Advantageously in this invention, the contribution from said spurious current is cancelled by a modified row decode structure provided within the non-volatile memory device.

Figure 3:
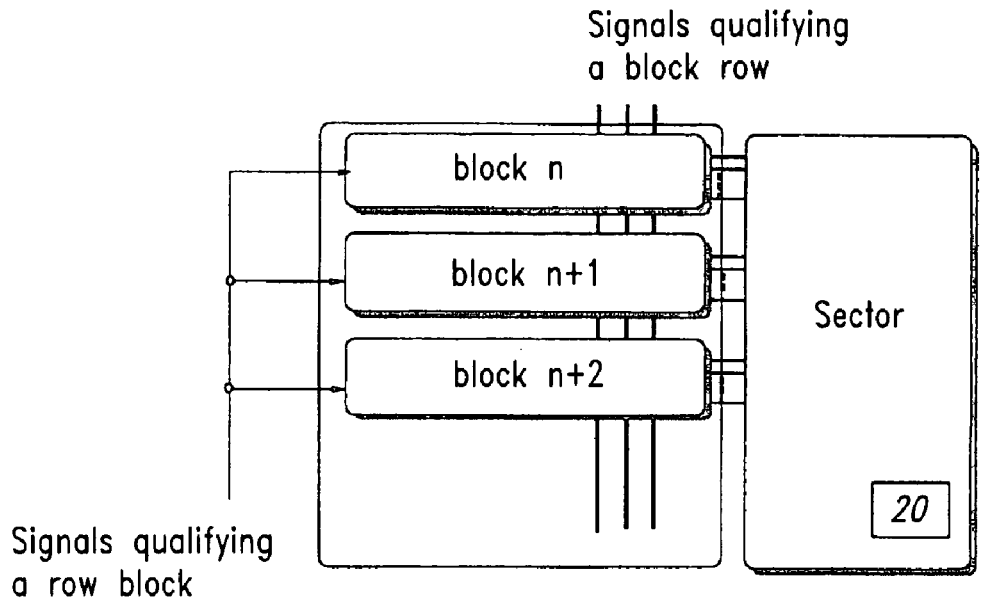
FIG. 3 schematically shows the row decode arrangement in an integrated non-volatile memory device according to the prior art.

In many memories the row decode feature is obtained by having a basic decode block, associated with a memory cell array sector, replicated n times; some addresses will enable a given block, and others will enable a row within the given selected block. This pre-encoding and decoding procedure allows a huge number of rows to be addressed by using a few signals. This structural scheme is illustrated in FIG. 3.

Figure 4:
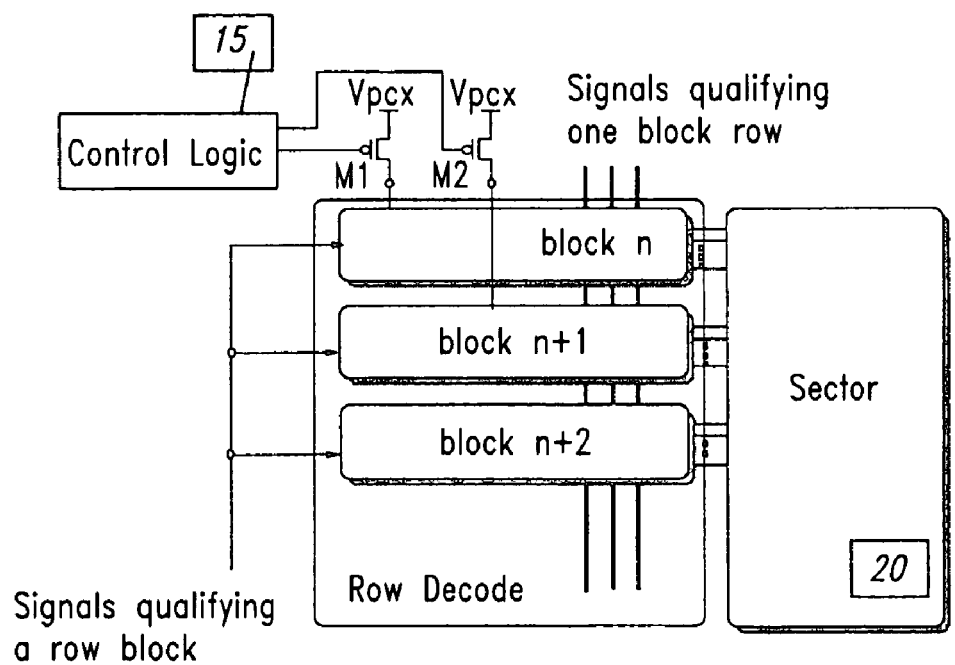
FIG. 4 schematically shows a detail of the row decode arrangement in an integrated non-volatile memory device according to the invention.

To suppress the spurious current, the invention employs at least one switch placed between the power supply and the decode blocks, as shown in FIG. 4.

While only a first switch M1 and a second switch M2 are shown in FIG. 4, which are connected between the positive supply Vpcx and the first two of the decode blocks, a separate switch between the power supply and each decode block would be preferable.

Several different constructions are viable for the switches, although simple MOS transistors, in particular NMOS transistors, are preferred.

Thus the positive supply Vpcx for reading and programming can be disconnected from a row block, in particular a row block that contains a failed cell.

Control logic 15 is arranged to control the transistor switches. The logic 15 is operatively interlinked with the contents of redundancy registers. The redundancy registers store the addresses of the failed rows and thus this information is provided to the control logic as to which rows to disconnect from the power supply.

This solution does not totally solve the erase problem, but it allows a row block containing a failed cell to be pinpointed during read and program operations.

To segregate the row block that contains a failed cell, a switch could be also provided in the conduction path from the negative voltage to the array rows, while still going through the row decode. In one embodiment, this is an NMOS transistor as customarily provided in the final stage of a so-called row driver.

For this purpose, an additional switch is provided within the row decode blocks.

Figure 5:
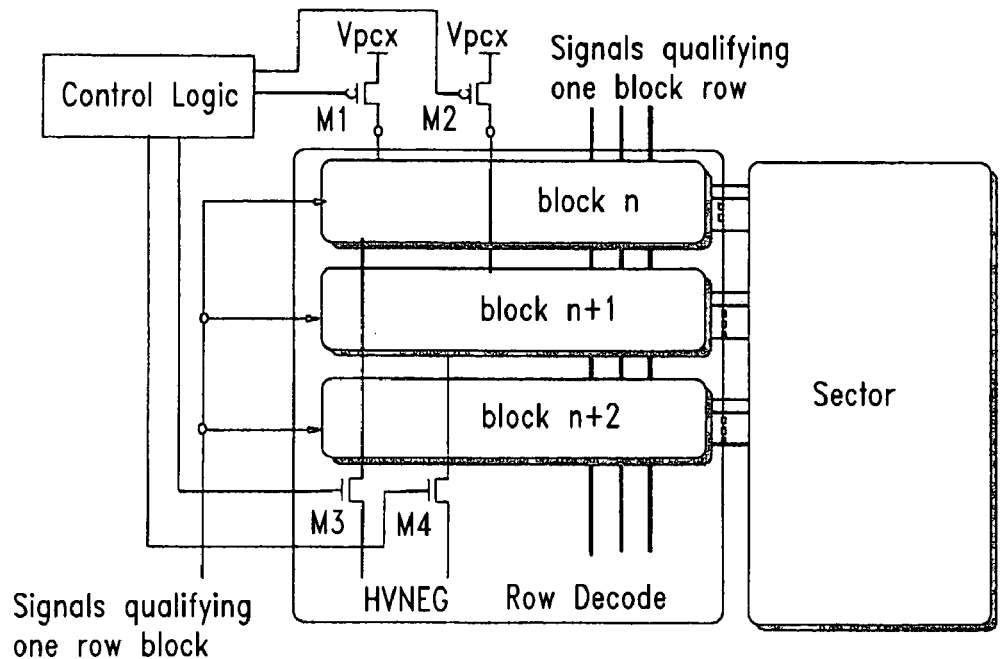
FIG. 5 schematically shows another detail of a row decode arrangement according to the invention.

Shown in FIG. 5 is an embodiment of the above arrangement where a switch M3 in block n and a switch M4 in block (n+1) are provided.

Also in this case, although the switches can be made with different constructions, simple MOS transistors, specifically NMOS transistors, are preferred.

The switches M3, M4 are inserted in a conduction path through which the first and second decode blocks can be applied a negative voltage HVNEG for the purpose of cutting off the row block that contains a failed cell each time that the sector where the failed cell locates is addressed. These switches M3, M4 are controlled by the logic 15 interlinked to the redundancy registers.

The switches provided, M3 or M4, allow a row associated with a given sector to be set to float during operations that make use of the source and gate terminals of a given cell.

Figure 6:
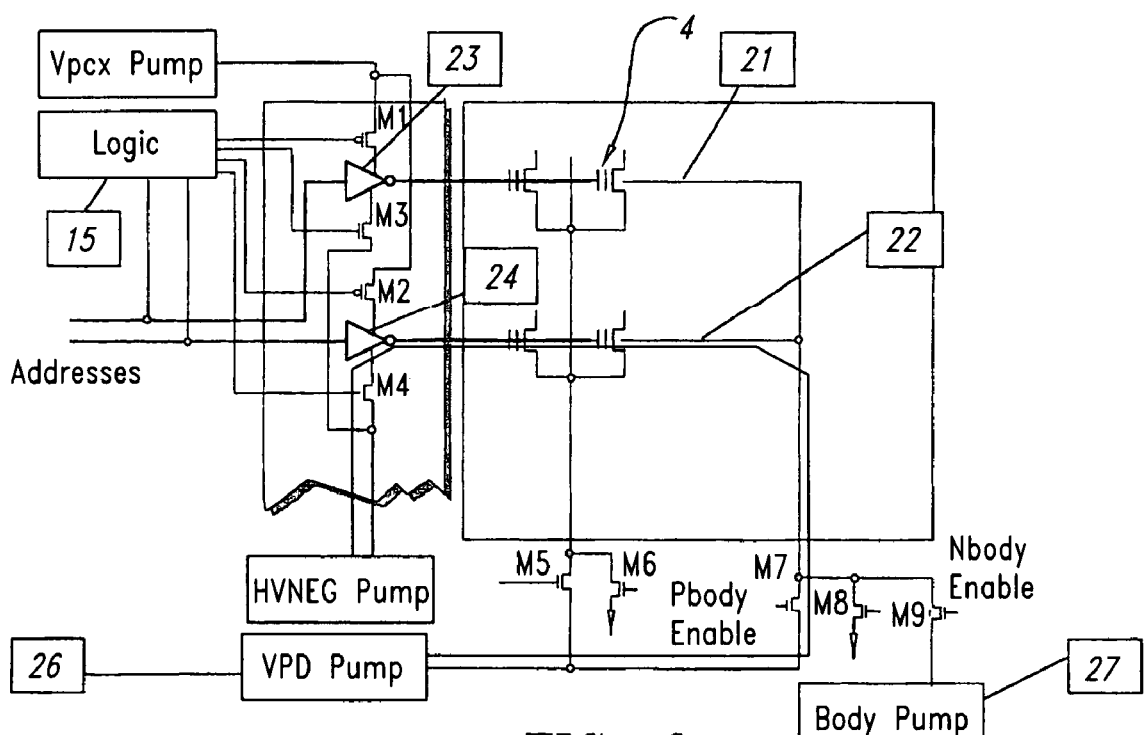
FIG. 6 shows a detailed view of the memory device according to the invention, shown at one stage of its operation.

FIG. 6 shows in greater detail the general circuit layout that would be called to work in an erase operation.

One sector 20 is shown there for simplicity, which contains four cells 4 located in two rows 21, 22, and associated final drivers 23, 24 of the same rows.

Transistors M1 and M2 are switches connected between the positive supply voltage Vpcx, which voltage would be taken to a row of memory array sector 20 during cell read and program operations. Transistors M3 and M4 are switches connected between the negative voltage supply HVNEG, this voltage being taken to the same row of the array sector 20 during an erase operation. The row is applied ground voltage during the read and program operations.

FIG. 6 also shows a VPD positive charge pump 26 arranged to take a positive voltage to the source and substrate regions 6 and 5 of the cell 4. The substrate and source voltages of the cell 4 can be made unrelated to each other since, during the program operation, the body region can be brought to a negative potential, while the source is held to ground. This increases programming efficiency.

An enable transistor M5 is connected in a conduction path that connects the pump 26 to the source regions 6, and an enable transistor M7 is inserted in a conduction path that connects the pump 26 to the body regions.

The possible negative voltage is supplied over another conduction path that includes an enable transistor M9, as shown in FIG. 6. A negative voltage charge pump 27 is specifically provided for the body regions.

As shown in FIG. 6, assuming the failed cell to locate in row 24, a possible fail condition would short the supply charge pump HVNEG to the positive voltage charge pump VPD through transistors M4, M5 and M7.

Figure 7:
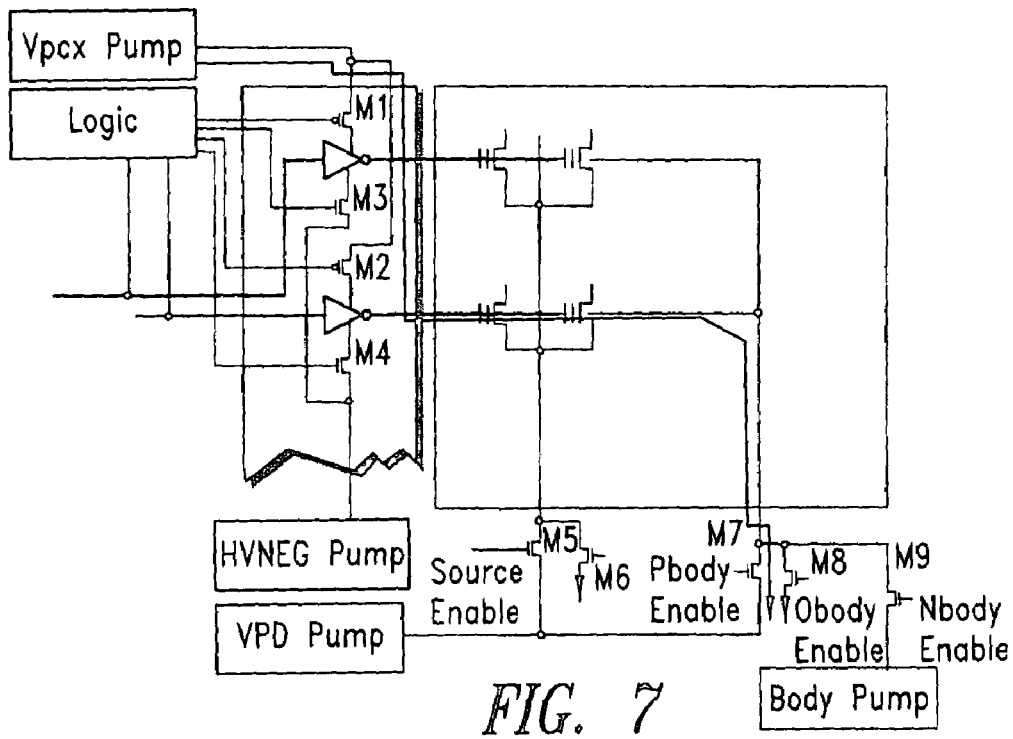
FIG. 7 shows a detailed view of the memory device according to the invention, shown at another stage of its operation.

Likewise, a discharge path is activated between the positive supply pump Vpcx to the gates and the substrate 5, as shown in FIG. 7.

Figure 8:
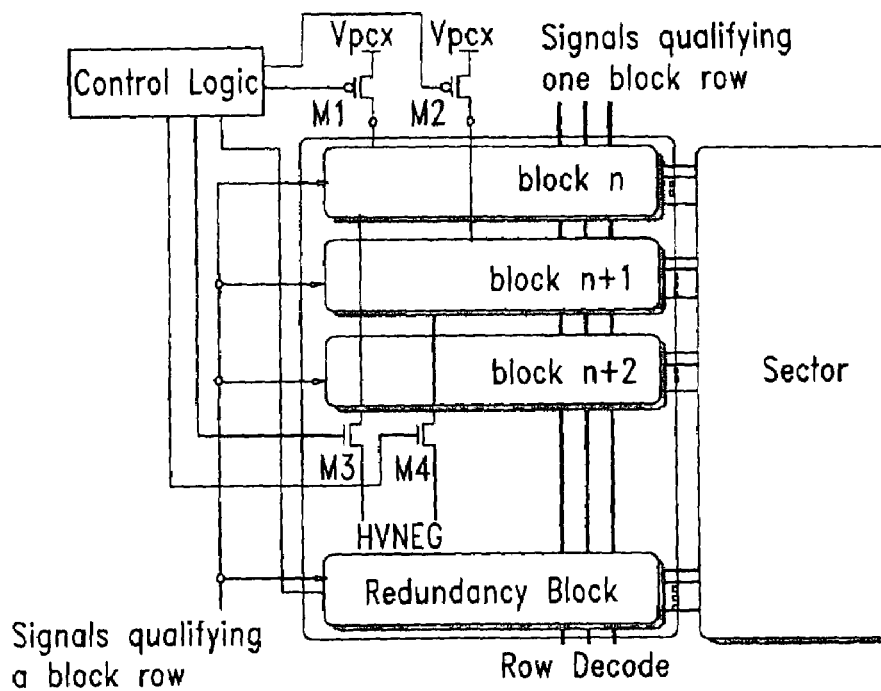
FIG. 8 schematically shows an embodiment of a row decode arrangement according to the invention.

Thus, according to this invention, in order to suppress the spurious current contribution, the row that contains a failed cell, e.g., row 24, is placed into a floating state. This is achieved by driving the switches M1, M2 by means of the redundancy register signals that are associated with the positive supply VPCX, as well as the switches M3, M4 that are associated with the negative supply HVNEG and belonging to blocks of rows placed inside one sector. Concurrently therewith, the corresponding switches of a redundant row block provided inside one sector 20 and associated with a respective decode block 28, as shown in FIG. 8, are enabled.

An explanation of how a failed state is detected, and the location of the failed cell in a sector found out in order to correct the situation by the method of this invention will now be provided.

To identify the row that contains the failed cell and have the failed cell address recorded in the redundancy registers, the faulty row must be first singled out. This complication is the price to be paid in order to have only one part of the sector replaced.

This operation would be unnecessary in case the whole sector were replaced. If an erase operation is completely unsuccessful, the whole sector might have to be replaced with a redundant sector, as conventionally done in the art.

Since a fail condition is due to at least one cell causing a short circuit between the gate region and the substrate, a spurious current can be detected across the gate and body terminals of the failed cell. This spurious current would not be present in the memory device under normal conditions; in fact, the node of the array row is a purely capacitive node with no currents to other points when the row contains only sound cells (actually, each row exhibits a resistance of a few kiloOhms).

The failed cell, or merely the failed row, can be recognized by detecting this current.

Figure 9:
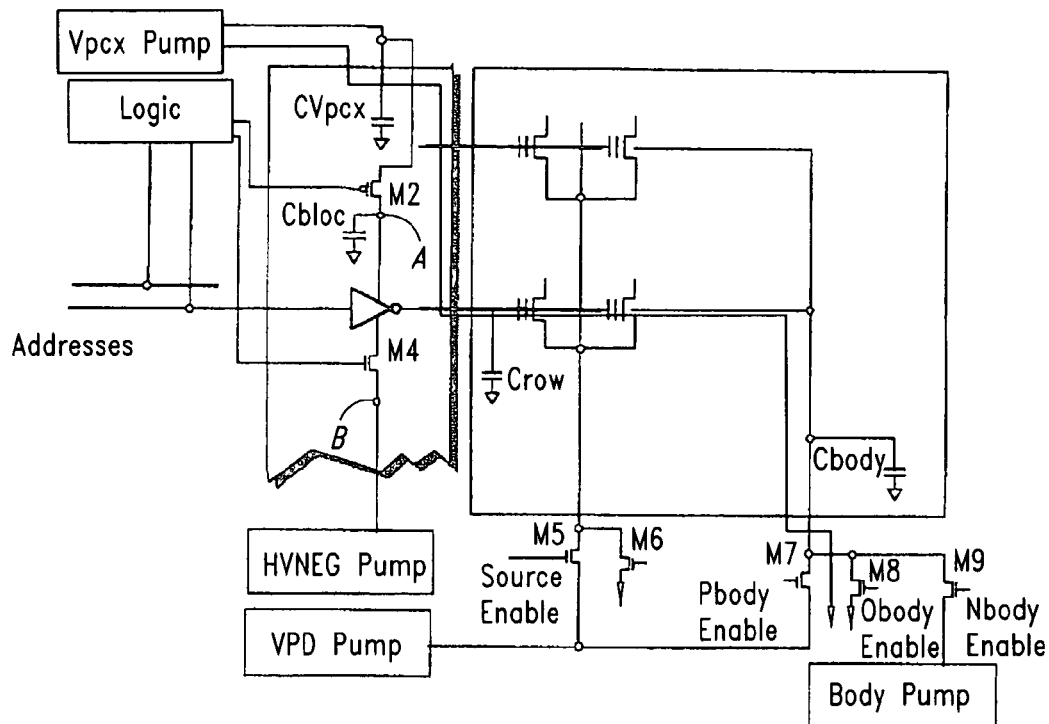
FIG. 9 shows a detailed view of the memory device according to the invention, shown at said another stage of its operation, but with an indication of parasitic capacitance.

A preferred procedure is that of using the memory device to force the sector that has not been fully erased into a read state; in this way the sector rows are scanned and the path shown in FIGS. 7 and 9 checked for the presence of a current through it.

Compared with FIG. 7, some components are omitted from, and major parasitic capacitances shown, in FIG. 9. These parasitic capacitances are itemized here below as:

Crow, a row capacitance on the order of a picoFarad;

Cvpcx, the capacitance of a whole row decode, on the order of 100 pF;

Cbloc, the capacitance of a row block; if each block has eight rows, for example, this capacitance may amount to 1 pF;

Cbody, the capacitance of the sector substrate node located in a fully isolated well during channel erasing; this capacitance is on the order of a nanoFarad.

Under these conditions, the spurious current detection should take capacitance Cbody into account. Because of its size, this capacitance, which would normally be held to ground by an associated enable transistor M8, behaves like a short on the current transient.

If the row that contains a failed cell were addressed, a heavy current would fill the parasitic capacitor Cbody within a time 1 us, when 10 mA is available and it must be charged at no more than 1 V. Of course, the charge voltage of the capacitor would be also dependent on the resistance between the supply Vpcx and the body region. In addition, the charge current sought would not be available because the pump Vpcx is current limited.

Accordingly, two are the possible occurring cases: waiting for a long time or no significant current can be detected through M8.

It would be necessary to detect a current variation through transistor M3, tantamount to picking up a voltage at node A and comparing it with a reference value to detect whether the current in question is a regular or a spurious current, indicating a failed state.

However, in this case it would be necessary to pick up the voltage at node A for each set of rows, by expanding the row decoding capacity that could be excessive during the reading phase.

Thus, picking up a voltage potential at node B, between switch M4 and the respective negative supply, is preferable. This node is ineffectual on the read path capacity, so that a potential can be picked up for each row block.

Actually, the node from which the potential for detecting the spurious current must be picked up is easily found, because the source regions of the transistor switches associated with the negative supply all focus on the HVNEG block. It could be thought, therefore, of replicating the structure of each sector.

Figure 10:
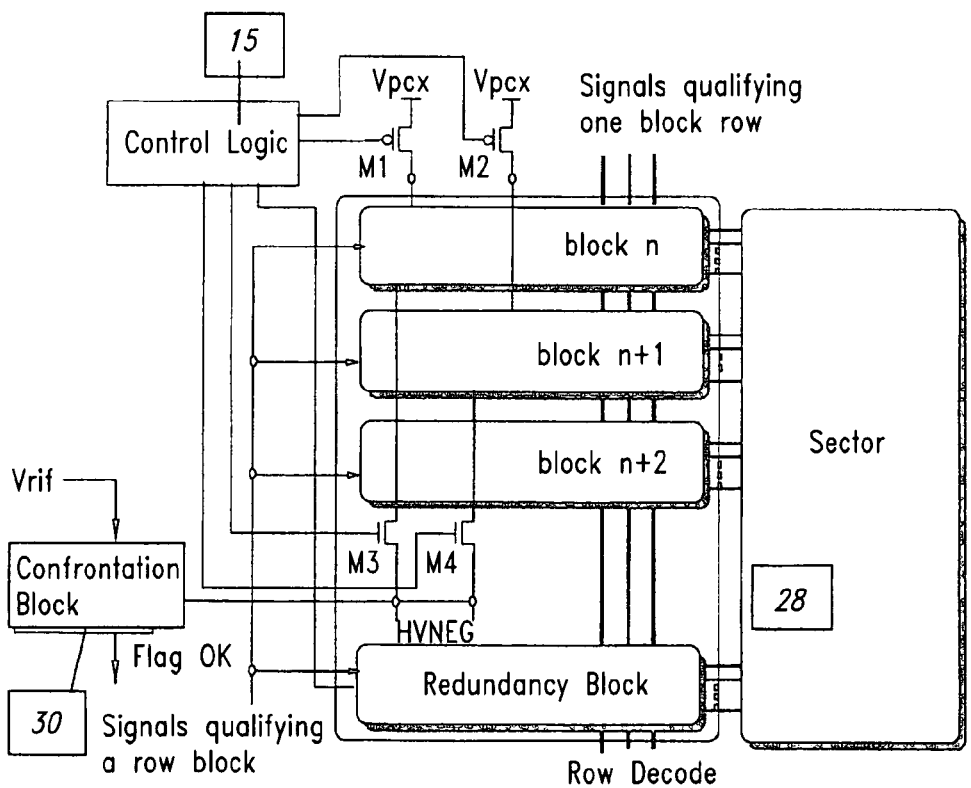
FIG. 10 shows a general view of the row decode embodiment shown in FIG. 8.

A compare block 30, shown in FIG. 10, picks up the voltage at node B, this being the voltage at the row start, and monitors its rise curve. If a spurious current exists the row will tend to rise, thus revealing the presence of the spurious current.

The compare block 30 is input a reference signal Vrif from a redundant row or dummy row, known to be operative. This signal is obtained simply by duplicating the affected path with a set of rows that is never erased and never could have potentials such to originate the fault.

Figure 11:
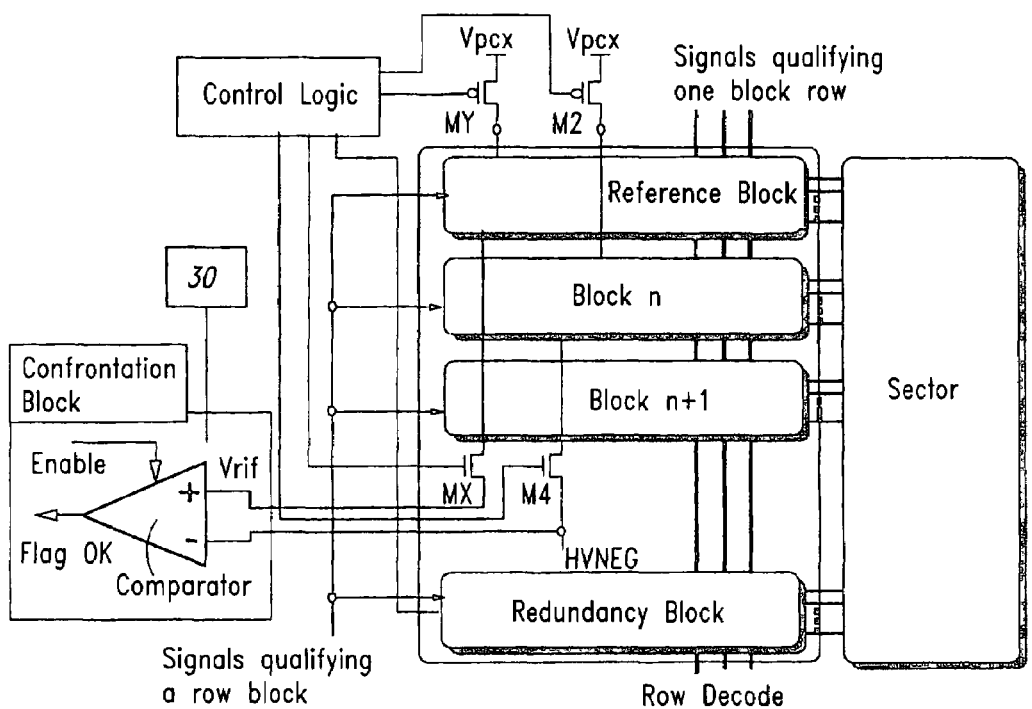
FIG. 11 schematically shows a structurally detailed view of the row decode embodiment shown in FIG. 8.

The inner structure of block 30 is shown in detail in FIG. 11. This block includes a comparator and illustrates the general architecture for row decoding of this invention.

Figure 12:
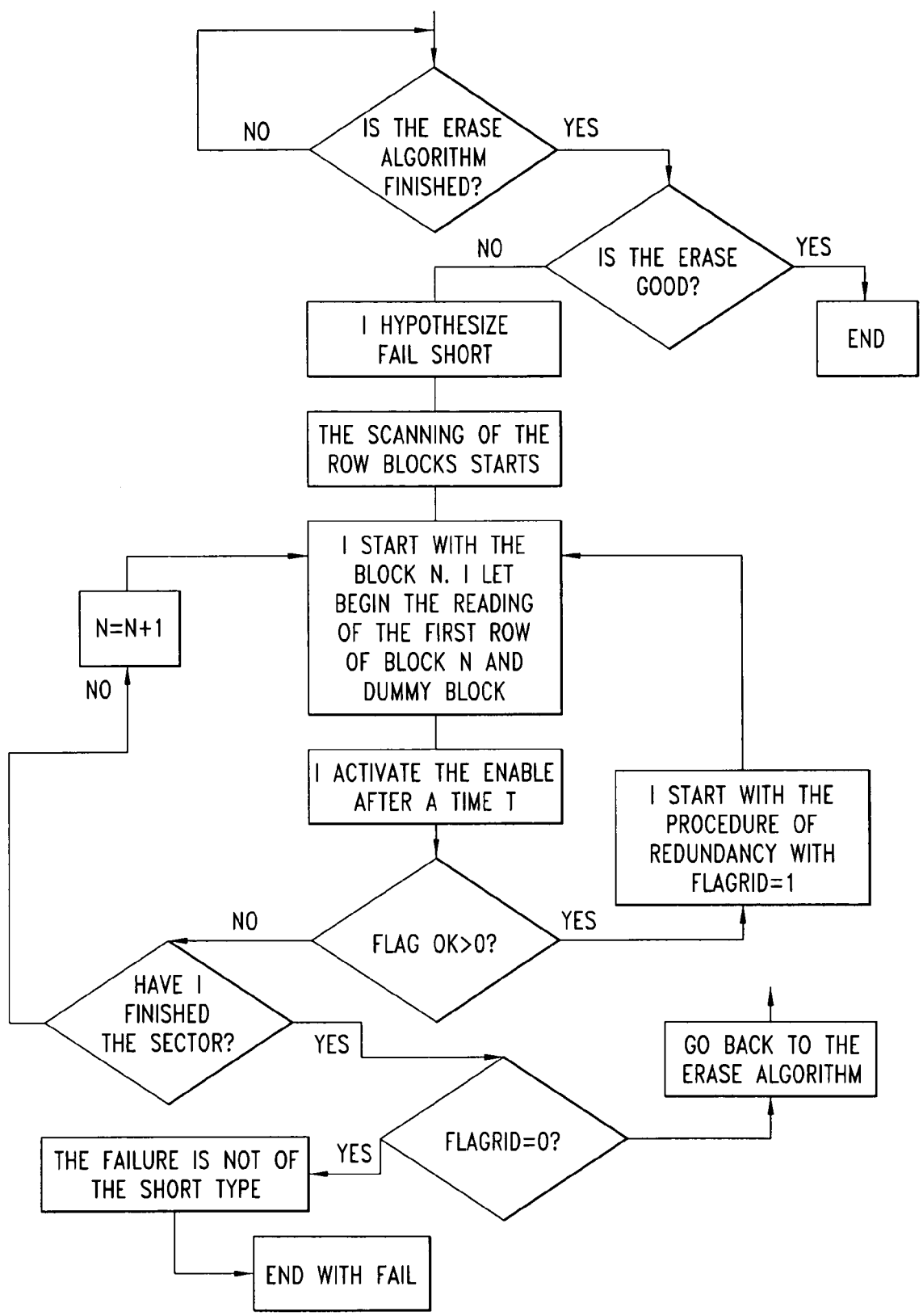
FIG. 12 is a flow chart showing the main operations performed by the memory cell erasing method according to the invention.

The flow chart of FIG. 12 schematically shows the main steps of the erasing method of this invention.

If at the end of the erase operation such an operation is unsuccessful, a fail situation of the above described short-circuit type may exist. Of course, the failure might be more serious and extensive than that and not remediable by this invention.

Where the fault can be corrected, the read algorithm is started in order to scan the row blocks in the estimated failed sector. Concurrently therewith, each time that a row block is addressed, a dummy row block will also be addressed, and after a time T of about a few tens nanoseconds (the time required for the row to become charged), a comparison of the two nodes in block 30 can be performed. The node of the redundancy dummy row will be the same value as the supply Vpcx, but the node of the addressed row in the addressed block 20 is bound to be a different value because of the spurious current.

If the signal "flagok" is positive, then a failure has occurred. The replacement algorithm "on line" of the row block is then started to activate a redundant row.

One or more redundant rows are provided close to the rows in the sector, preferably within each sector in one embodiment, or in a location adjacent to the sector, within a threshold distance, so they can easily be provided to replace a row in a sector.

Thereafter, the remaining rows will be analyzed because the possibility of multiple failures cannot be ruled out.

In the other case, the search is maintained to the sector end. On completion of the analysis, the position of the redundancy flag tells whether the operation has been successful.

Of course, the erase algorithm is now to be re-started, and this may require more time than a device without any failed rows would require.

This longer erase time is a small trade-off of the benefit of the inventive teachings: the savings in redundancy circuit area and the ability to restore a failed device to normal operation make the increased erase time of trivial consideration.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for erasing non-volatile memory cells in an integrated non-volatile memory device that comprises a memory cell array organized in a row-and-column layout, and divided in array sectors, the method comprising:
   forcing an incompletely erased sector into a read condition;
   scanning rows of said sector to check for possible presence of a spurious current indicating a fail state;
   identifying and selectively electrically isolating a failed row associated with the fail state, the electrical isolating including placing the failed row in a floating state by decoupling the failed row from first and second power supplies of different polarity;
   re-addressing from said failed row to a redundant row within a threshold distance of the failed row; and
   re-starting an erase algorithm.

2. A method according to claim 1 wherein said read condition is forced whenever a result of the erase algorithm is incomplete or negative.

3. A method according to claim 1 wherein rows of a given sector are scanned, also checking for possible presence of said spurious discharge current in a conduction path leading to a positive power.

4. A method according to claim 3 wherein said spurious current is detected by comparison of a row node with a redundancy node.

5. A method according to claim 4 wherein said comparison is effected by a compare block, to which is input a reference signal produced from a redundant row and a row signal taken at a beginning of a row being scanned.

6. A method according to claim 1 wherein at least one switch is provided between each decode block and respective positive and negative power supplies, respectively comprising the first and second power supplies, in order to isolate the failed row.

7. A method according to claim 6 wherein said switches are driven by a logic operatively interlinked to contents of redundancy registers.

8. A method according to claim 1 wherein said re-addressing is effected using a redundancy decode block incorporated inside row decode circuitry.

9. The method according to claim 1 wherein the redundant row is adjacent to a sector containing the failed row.

10. The method according to claim 1 wherein the redundant row is in a same sector as a sector containing the failed row.

11. The method of claim 1 wherein selectively electrically isolating the failed row includes selectively electrically isolating the failed row while other rows in said sector continue to be powered by said first and second power supplies.

12. An integrated non-volatile memory device of the programmable and electrically erasable type, comprising a memory cell array organized in a row-and-column layout, and divided in array sectors, each including at least one row decode circuit portion being supplied positive and negative voltages, the device comprising:
a redundant row block inside each sector;
a plurality of row decode blocks and at least one redundancy decode block within the decode circuitry; and
at least one switch between each one of the decode blocks and the respective positive and negative voltages in order to selectively isolate a failed row during read, program or erase operations, including capability of the switches to place the failed row in a floating state by respectively decoupling the failed row from the positive and negative voltages.

13. A device according to claim 12 wherein said switches are MOS transistors.

14. A device according to claim 12, further comprising control logic for controlling said switches.

15. A device according to claim 14 wherein operation of said logic is interlinked with contents of redundancy registers.

16. A device according to claim 12, further including a comparing block, the comparing block receiving an input reference signal produced by a redundant row and a row signal taken at a start of a row being scanned.

17. The device of claim 12 wherein other rows in a same sector as the failed row continue to be supplied with the positive and negative voltages, while the failed row is in the floating state.

18. A method for erasing non-volatile memory cells, the method comprising:
dividing a non-volatile memory device in array sectors;
forcing an incompletely erased sector into a read condition;
scanning rows of said sector;
comparing a row node with a redundancy node to check for possible presence of a spurious current indicating a fail state;
identifying and electrically isolating a failed row associated with the fail state;
re-addressing from said failed row to a redundant row, the redundant row being within a threshold distance of the failed row; and
re-starting an erase algorithm.

19. A method according to claim 18 wherein said comparison is effected by a compare block that receives a reference signal produced from a redundant row and a row signal taken at a beginning of a row being scanned.

20. An integrated non-volatile memory device of the programmable and electrically erasable type, the memory device comprising:
a memory cell array organized in a row-and-column layout and divided in array sectors, each of the memory cell arrays having at least one row decode circuit portion coupled to first and second potentials;
a redundant row block inside each sector;
a plurality of row decode blocks and at least one redundancy decode block within the decode circuitry;
a comparing block, the comparing block receiving a reference signal produced by the redundant row and a row signal taken at a start of a row being scanned; and
at least one switch between each one of the decode blocks and the respective first and second potentials in order to isolate a failed row during read, program and erase operations.

21. The memory device of claim 20 wherein other rows in a same sector as the failed row continue to be supplied with the first and second potentials, while the failed row is in the isolated and floating state.

22. The memory device of claim 20 wherein the first and second potentials respectively comprise positive and negative potentials.

* * * * *